(12) United States Patent
Shimizu

(10) Patent No.: US 6,744,798 B2
(45) Date of Patent: Jun. 1, 2004

(54) SURFACE-TYPE LIGHT AMPLIFER DEVICE AND METHOD OF MANUFACTURE THEREOF

(75) Inventor: Mitsuaki Shimizu, Tsukuba (JP)

(73) Assignee: Agency of Industrial Science and Technology, Tokyo (JP)

( * ) Notice: Subject to any disclaimer, the term of this patent is extended or adjusted under 35 U.S.C. 154(b) by 0 days.

(21) Appl. No.: 10/226,297

(22) Filed: Aug. 23, 2002

(65) Prior Publication Data

US 2003/0002146 A1 Jan. 2, 2003

Related U.S. Application Data

(62) Division of application No. 09/646,904, filed as application No. PCT/JP99/01689 on Mar. 31, 1999, now Pat. No. 6,480,516.

(51) Int. Cl.[7] .................................................. H01S 5/00
(52) U.S. Cl. ........................................................ 372/43
(58) Field of Search ..................... 372/43, 50; 359/344, 359/346; 320/250

(56) References Cited

U.S. PATENT DOCUMENTS 5,182,758 A * 1/1993 Taneya et al. ................. 372/46
6,081,540 A * 6/2000 Nakatsu ......................... 372/45

* cited by examiner

*Primary Examiner*—David Porta
*Assistant Examiner*—Davienne Monbleau
(74) *Attorney, Agent, or Firm*—Oblon, Spivak, McClelland, Maier & Neustadt, P.C.

(57) ABSTRACT

A surface-type light amplifier device has an active layer of a light amplification section sandwiched between an n-type semiconductor cladding layer that is an n-type semiconductor layer and a p-type semiconductor multilayer reflecting mirror. The light amplification section is attached to a transparent substrate on the side of the n-type semiconductor cladding layer. A plurality of divided electrodes form electrical continuity relative to the p-type semiconductor multilayer reflecting mirror via a p-type cap layer provided on the reflecting mirror. An electrode forming electrical continuity relative to the n-type semiconductor cladding layer is connected to a wiring conductor provided on the surface of the transparent substrate. The device enables amplification of a single, uniform, large diameter beam and oscillation of a laser.

2 Claims, 2 Drawing Sheets

PRIOR ART

US 6,744,798 B2

SURFACE-TYPE LIGHT AMPLIFER DEVICE AND METHOD OF MANUFACTURE THEREOF

This application is a Division of application Ser. No. 09/646,904 filed on Oct. 10, 2000 which was filed as PCT/JP99/01689 filed Mar. 31, 1999.

FIELD OF THE INVENTION

The present invention relates to a surface-type light amplifier device usable as a surface light emitting laser etc. when a resonator is disposed outside the device and to a method for the manufacture thereof. The "surface-type" light amplifier device referred to herein is a device comprising a light function portion for amplifying and emitting light and a substrate for physically supporting the light amplification function portion, wherein the emitted light rises with a specific angle relative to the surface of the substrate, generally in the direction of intersecting the substrate surface at right angles (in the normal direction).

DISCUSSION OF THE BACKGROUND

As for surface-type light amplifier devices of this type, there is the one disclosed in Reference Literature 1: "Electrically pumped mode-locked vertical-cavity semiconductor lasers" (W. Jiang, M. Shimizu, R. P. Mirin, T. E. Reynolds and J. E. Bowers, Optics Letters, Vol. 18, No. 22, pp. 1937–1939, 1993). As shown in FIG. 2, the prior art surface-type light amplifier device 30 structurally comprises an n-type GaAs substrate 31 on which a multilayer reflecting mirror of n-type semiconductor 32, an n-type cladding layer 33, an n-type GaAs active layer 34, a p-type cladding layer 35, a p-type AlGaAs layer 37 and a p-type GaAs contact layer 38 are deposited in the order mentioned. The p-type AlGaAs layer 37 and p-type GaAs contact layer 38 are partially cut off into a shape having a shape having a predetermined surface area. An antireflection coating 39 is deposited onto the top surface of the p-type GaAs contact layer. A surface electrode 40 is formed on the p-type cladding layer 35, with an insulating film 36 sandwiched therebetween, so as to surround the cut-off portions and come into contact with the top peripheral part of the p-type GaAs contact layer 38. A substrate electrode 41 is deposited on the bottom surface of the n-type substrate 31.

Injection of carriers into the n-type GaAs active layer 34 is attained by current injection, i.e. by applying voltage between the surface electrode 40 and the substrate electrode 41.

Holes are injected from the surface electrode 40 into the n-type GaAs active layer 34 sequentially via the p-type GaAs contact layer 38, p-type AlGaAs layer 37 and p-type cladding layer 35. Electrons are injected from the substrate electrode 41 into the n-type GaAs active layer 34 sequentially via the n-type GaAs substrate 31, multilayer reflecting mirror of n-type semiconductor 32 and n-type cladding layer 33.

When the prior art device 30 is used as a light amplifier device or particularly as a surface-emitting laser, the associated resonator comprises the multilayer reflecting mirror of n-type semiconductor 32 built in the device and an external reflecting mirror (not shown). Between the external reflecting mirror not shown and the antireflection coating 39 there is generally disposed a lens (not shown). It goes without saying that the antireflection coating 39 is used for reducing the resonator loss and obtaining the light gain. For the same reason, the layers 33 to 35, 37 and 38 are subjected to treatments such as for suppressing the impurity concentration etc. to a low degree so that the optical absorption loss can be lowered.

FIG. 3 shows another prior art surface-type light amplifier device 50. This device is disclosed in Reference Literature 2: "High single-transverse-mode output from external-cavity surface-emitting laser diode" (M. A. Hadley, G. C. Wilson, K. Y. Lau and J. S. Smith, Appl. Phys. Lett., Vol. 63, No. 12, pp. 1607–1609, 1993) and comprises a GaAs substrate 51 not of n-type but of p-type, on which a multilayer reflecting mirror 52 of p-type semiconductor, a p-type multi-quantum well active region 53 and a multilayer reflecting mirror 55 of n-type semiconductor are deposited in the order mentioned. Voltage is applied between a substrate electrode 57 deposited on the bottom surface of the substrate 51 and a bonding pad 56 disposed on an insulating film 54 and brought into contact with the top peripheral surface of the multilayer reflecting mirror of n-type semiconductor 55 to inject an electric current (carriers) into the multi-quantum well active region 53, thereby obtaining excited light. Holes are injected from the side of the substrate electrode 57 into the multi-quantum well active layer 53 via the p-type GaAs substrate 51 and the multilayer reflecting mirror of p-type semiconductor 52, whereas electrons are injected thereinto from the opposite side, i.e. from the bonding pad 56, via the multilayer reflecting mirror of n-type semiconductor 55.

This device 50 is, by nature, not a device for an external resonator. However, in the case that a resonator is composed only of the multilayer reflecting mirror of n-type semiconductor 55 and the multilayer reflecting mirror of p-type semiconductor 52 embedded in the device, it inevitably poses a substantial problem that the transverse mode does not become a single lobe when the diameter of the device is made large. In order to solve the problem it is necessary to provide an external reflecting mirror not shown. Single-lobe beams can be obtained by deliberately lowering the reflectivity of the multilayer reflecting mirror of n-type semiconductor 55, then providing a suitable reflecting mirror outside the device on the side of the multilayer reflecting mirror of n-type semiconductor 55, and adjusting the position of a lens disposed in an optical path toward the external reflecting mirror, for example. In any event, the resonator has a composite construction comprising a first resonator composed of the multilayer reflecting mirror of p-type semiconductor 52 and the multilayer reflecting mirror of n-type semiconductor 55 which are provided in the device and a second resonator composed of the multilayer reflecting mirror of p-type semiconductor 52 and the external reflecting mirror.

In the device 30 shown in FIG. 2, however, it is particularly difficult to obtain laser beams having a large diameter. This is because, if the effective area of the n-type GaAs active layer 34, i.e. the area coated with the antireflection coating 39 and actually contributing to oscillation, is made large for enlarging the device diameter, it will become impossible to uniformly inject holes into that area. This results solely from the fact that each of the p-type semiconductor layers 38, 37 and 35 has high electrical resistance. In order to inject holes into the neighborhood of the center of the effective area of the n-type GaAs active layer, it is necessary to cause the holes first to flow through the p-type semiconductor layers 38, 37 and 35 in the in-plane direction from the surface electrode 40 in contact with the peripheral edge of the antireflection coating 39 and then to be injected into the center of the n-type GaAs active layer 34. In the actual course of operation, however, this cannot be attained because the majority of holes are injected into the peripheral edge of the p-type GaAs contact layer 38 from the surface electrode 40 and then advance straightforward without being well spread laterally and reach the n-type GaAs active layer 34.

In order to actually secure the state of uniform hole injection into the n-type GaAs active layer 34 in the conventional device 30 fabricated in accordance with such structural principle, it is required to reduce the diameter of the effective area of the n-type GaAs active layer 34 to not more than tens of $\mu$m. That is to say, when a large output power is required, it is necessary to adopt a method of arraying a plurality of devices, resulting in sacrifices of singleness and uniformity of optical beams.

In the conventional device 50 shown in FIG. 3, however, since holes can be injected from the substrate electrode 57 in surface contact with the back surface of the p-type GaAs substrate 51, the uniformity in the in-plane distribution of holes injected into the p-type multi-quantum well active region 53 will be satisfied. However, the serious problem is that the device has a composite resonator structure which cannot constitute a pure external resonator type surface light emitting laser and since the multilayer reflecting mirror of n-type semiconductor 55 incorporated in the device generally has a reflectance of not less than about 80%, the device is not suitable as a surface-type light amplifier device. In addition, due to the composite resonator structure, light pulses cannot be generated in the mode-locking operation.

Furthermore, since the multilayer reflecting mirror of n-type semiconductor 55 having a resistance lower than that of a p-type one is used for the sake of electron flow in the in-plane direction, the structure is designed for injecting electrons into the neighborhood of the center of the multi-quantum well active region 53. However, if the diameter of the multi-quantum well active area 53 is set larger, the electrical resistance of the multilayer reflecting mirror of n-type semiconductor 55 cannot be ignored and unevenness in the current injection is induced. That is to say, for uniform current injection, the upper limit of the effective area of the multi-quantum well active area 53 is about 100 $\mu$ in diameter though it is larger than that of the conventional device 30 shown in FIG. 2. In particular, it is impossible to control the injection of holes into the active layer because the p-type electrode is the substrate electrode and an electric current is injected through the substrate.

SUMMARY OF THE INVENTION

The present invention has been proposed in view of the problems mentioned above, and its object is to provide a surface-type light amplifier device having at least a light amplification section including a structure of an active layer sandwiched between p-type and n-type cladding layers and emitting a light beam in the direction rising with a specific angle (generally, 90° as stated above) relative to the surface of a support substrate, wherein the amplification of a single and uniform light beam or, if required, a large-diameter light beam, and the laser oscillation can be attained.

The inventor believes that, in the final analysis, the various drawbacks of the conventional devices 30 and 50 shown in FIGS. 2 and 3 result from the presence per se of the n-type substrate 31 or the p-type substrate 51 forming the light amplification section contributing to the light amplification, namely, the multilayer structure including the semiconductor layers 32–35 and 37–38 in the device 30 shown in FIG. 2 or the multilayer structure including the semiconductor layers 52, 53 and 55 in the device 50 shown in FIG. 3.

It goes without saying that the substrate 31 or 51 is indispensable to the formation of the light amplification section and important even after the section has been formed as a support for securing the physical strength of the device. Insofar as the light amplifying function is concerned, however, the substrates 31 and 51 are rather unnecessary or obstructive. Since the substrates 31 and 51 generally have a large thickness of up to hundreds of $\mu$m, when a compound semiconductor substrate such as a GaAs substrate is employed, loss in passing amplified light therethrough is very large.

For this reason, both the conventional devices 30 and 50 shown in FIGS. 2 and 3 have a construction such that amplified light is not passed through the support substrates 31 and 51. This is the same in other conventional devices not touched upon here. In other words, various changes in construction for improving the characteristics of devices have heretofore had to be made on the major premise that light should not be passed through a substrate. This has brought about various restrictions. In the case of the conventional device 30 shown in FIG. 2, for example, since the light emitted from the light amplification portion has to be emitted from the side of the p-type semiconductor layers 35, 37 and 38 opposite the side at which the n-type GaAs substrate 51 is present, this light emitting surface cannot be covered by the electrode. As a result, an electric current has to be applied only through the peripheral edge of the p-type AlGaAs layer 37 to the the p-type cladding layer and then to the n-type GaAs active layer 34 as described above, thereby inducing the aforementioned uneven hole injection and difficulty in achieving a large device diameter.

In the case of the conventional device 50 shown in FIG. 3, the p-type GaAs substrate 51 is used in place of the n-type GaAs substrate, with the result that there is an advantage that the multilayer reflecting mirror of n-type semiconductor 55 can be disposed on the side opposite the side at which the substrate is present to achieve low resistance, but there are restrictions, such as requiring a composite resonance structure, resulting in the different drawbacks as described above.

DISCLOSURE OF THE INVENTION

In view of the above, the present inventor, exploding the well-established concept, has conceived the idea of removing a base substrate used for fabricating a light amplification section after the fabrication of the light amplification section. However, since the light amplification section is an extremely thin structure, such mere removal of the base substrate would decrease the strength of the light amplification section resulting in physical distortion producing optical distortion, and would not allow the light amplification section to be put into practical use. Therefore, the present invention provides a structure having the light amplification section attached to a transparent support substrate that is separate from the base substrate used in fabricating the light amplification section and exhibits a low loss when a light beam passes therethrough.

With this device structure, a light beam amplified at the light amplification section can be passed through the transparent substrate. This means that there arises a degree of freedom in structural design. For example, an electrode through which holes are injected into a p-type semiconductor layer with relatively high resistance can be made large. Furthermore, even when a plurality of divided electrodes are formed and a light beam is prevented from being emitted from the side of these electrodes as in the specific embodiment of the present invention which will be described later, various improvements can be realized by enabling a light beam to be emitted via the transparent substrate provided on the opposite side of the electrodes with the active layer of the light amplification section therebetween.

The present invention also provides a surface-type light amplifier device, as a preferred unsophisticated embodiment satisfying the above fundamental conditions, having a light amplification section attached to a transparent substrate on the side on which an n-type semiconductor layer is present and having a plurality of divided electrodes provided on the side across an active layer opposite the n-type semiconductor layer for injecting holes into a p-type semiconductor layer.

In this surface-type light amplifier device, it is possible to uniformly inject holes into the p-type semiconductor layer having higher resistance than an n-type one. In addition, since the in-plane distribution of the carriers in the active layer can be controlled by controlling the amount of an electric current applied to the divided electrodes, it is possible to control the in-plane distribution to conform to the light intensity distribution in the fundamental mode having a single lobe.

The present invention provides, as a more concrete unsophisticated embodiment, a surface-type light amplifier device wherein an active layer in a light amplification section is sandwiched between an n-type semiconductor cladding layer that is an n-type semiconductor layer and a p-type semiconductor multilayer reflecting mirror that is a p-type semiconductor layer; the light amplification section is attached to a transparent substrate on the side of the n-type semiconductor cladding layer; a plurality of divided electrodes attain electric continuity through a p-type cap layer provided on the p-type semiconductor multilayer reflecting mirror; and an electrode forming electrical continuity relative to the n-type semiconductor cladding layer is connected to a wiring conductor provided on the transparent substrate.

The present invention further provides a method for fabricating a surface-type light amplifier device, which includes the steps of forming a light amplification section on a structural substrate for the formation of that section, attaching a different transparent substrate to the exposed surface of the light amplification section, and removing the structural substrate.

As an unsophisticated embodiment of the aforementioned fabrication method, the present invention provides a fabrication method comprising the steps of successively forming a p-type semiconductor layer, an active layer and an n-type semiconductor layer in the order mentioned on the structural substrate, attaching the transparent substrate to the exposed surface of the n-type semiconductor layer, and forming a plurality of divided electrodes on the surface of the p-type semiconductor layer exposed after the removal of the structural substrate, thereby attaining electrical continuity relative to the p-type semiconductor layer.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
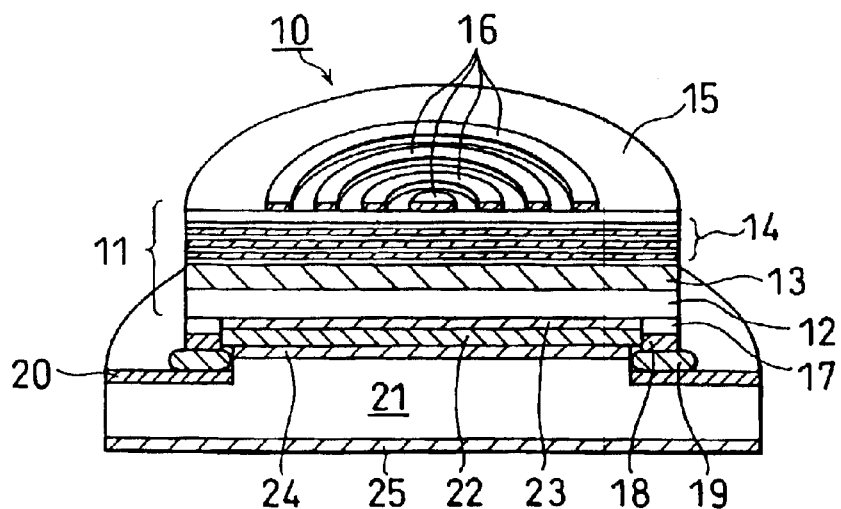
FIG. 1(A) is a schematic view showing the configuration of one example of a surface-type light amplifier device according to the present invention, FIG. 1(B) an explanatory view showing the process for fabricating the surface-type light amplifier device according to the present invention, FIG. 2 a schematic view showing the configuration of one typical example of a conventional surface-type light amplifier device, and FIG. 3 another typical example of a conventional surface-type light amplifier device.
Figure 1:
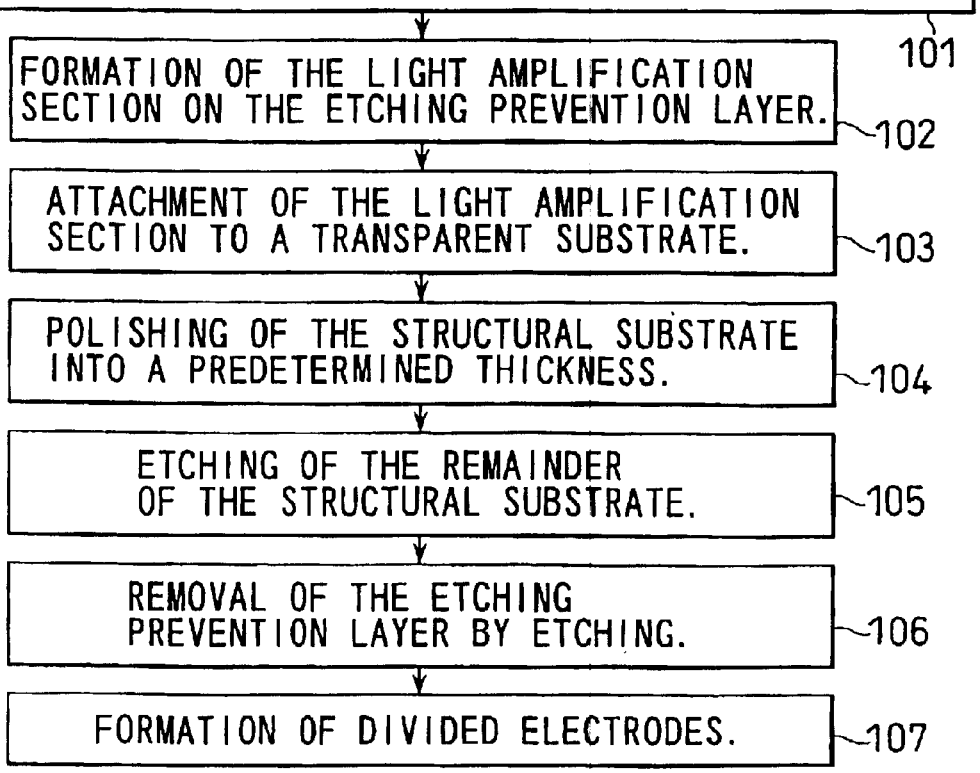
Figure 2:
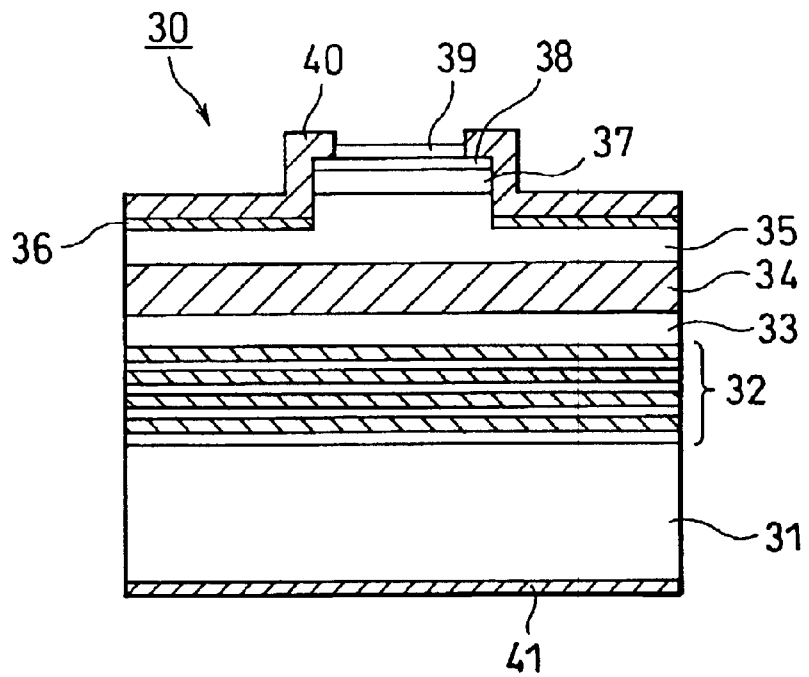

The present invention will now be described in detail with reference to the accompanying drawings.

FIG. 1(A) shows a schematic configuration of one example of surface-type light amplifier device 10 fabricated in accordance with the present invention. In the present invention, a light amplification section 11 including a structure of sandwiching between p-type and n-type semiconductor layers 14 and 12 an active layer 13 that produces excited carriers is attached by means of a transparent adhesive 22 to a transparent substrate 21 that differs from a structural substrate on which the light amplification section 11 has been formed. That is to say, FIG. 1(A) shows the state in which the structural substrate has been removed.

In the device 10 of the present invention thus configured, since a light beam produced at the light amplification section 11 can pass through the transparent substrate 21, the degree of freedom for constructional improvements in this section 11 increases. As described below, FIG. 1(A) discloses the configuration in one preferred unsophisticated embodiment in accordance with the present invention. However, there can be provided other various surface-type light amplifier devices in accordance with the fundamental construction of the present invention. The material for the transparent substrate 21 may be glass, plastic, etc. having very high transparency with respect to the oscillation wavelength. From these materials can be easily obtained one having transmittance of 99 to 99.9% with respect to transmission beams in the optical wavelength range. It is noted, however, that the larger the thickness, the larger the transmission loss even when the transmission is markedly high. Generally, however, the thickness of the substrate that can physically support the light amplification section 11 thereon and can ensure a strength thereof large enough to prevent the section from distortion falls in the range of hundreds of $\mu$m to several mm, in which range the transparency is fully satisfactory.

As the transparent adhesive 22 commercially available polyimide etc. can be used. Since such an adhesive agent has sufficiently high transmittance and is used in the form of a thin film, there arises no problem in use. Surface levelling (optical precision) of the transparent substrate 21 and uniform application of the transparent adhesive 22 can be satisfactorily attained with ease using any prior art technology. In order to avoid diffused reflection on the surface of the transparent substrate 21, the interface between the transparent substrate 21 and the transparent adhesive 22 and the interface between the transparent adhesive and the light amplification section 11, antireflection coatings 25, 24 and 23 are applied beforehand to these faces. The antireflection coatings can be constituted of a double-layer laminate structure of $TiO_2$ and $SiO_2$.

In the surface-type light amplifier device 10 of the present invention as shown in FIG. 1(A), the concrete construction of the light amplification section 11 is as follows. Attached through the transparent adhesive 22 and antireflection coating 23 to the transparent substrate 21 is an n-type cladding layer 12 that can be constituted, for example, of an n-type $Al_xGa_{1-x}As$ (x=0.3) layer having a thickness of about 2 $\mu$m.

On that layer is formed an active layer 13 that is the principal part of the light amplification section 11 and is constituted of a non-doped GaAs layer having a thickness of about 0.5 μm.

On the active layer 13 is formed a p-type semiconductor multilayer reflecting mirror 14 that is a p-type semiconductor layer and is constituted, for example, of a periodical repetition laminate structure of an $Al_xGa_{1-x}As$ (x=0.1) layer and a p-type AlAs layer. Each layer has a considerably small thickness, and the total thickness of the structure is approximately several μm. However, since such a semiconductor multilayer reflecting mirror per se is well known, it can be produced in accordance with an optional prior art technology.

Figure 3:
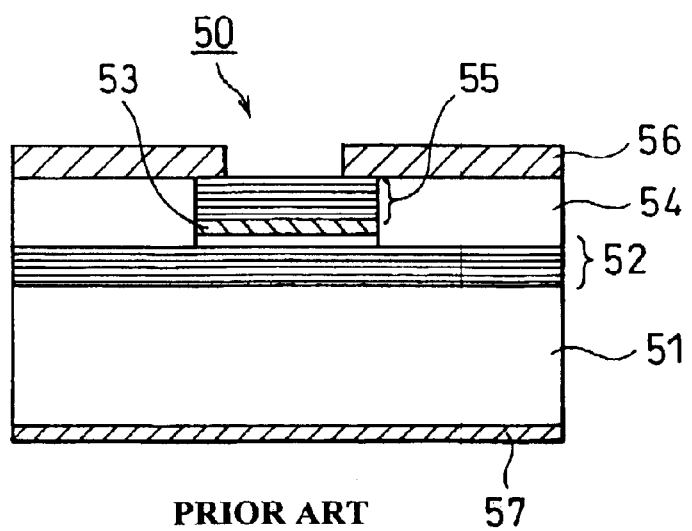

As will be understood from the fact that a semiconductor multilayer reflecting mirror 14 is used as a p-type semiconductor layer in the surface-type light amplifier device 10 shown in FIG. 1(A), the device has a structure such that a light beam produced at the active layer 13 is reflected by the reflecting mirror 14 and is radiated to an exterior space through the n-type cladding layer 12 and transparent substrate 21. Therefore, unlike the conventional device of FIG. 3 relying on the composite resonator structure constructed together with a resonator built in the device, it is possible to provide a complete unit of external reflecting mirror type light emitting laser, though not shown, by disposing a commercially available high-performance reflecting mirror, e.g. a planar dielectric multilayer reflecting mirror having reflectivity of not less than 99%, in an exterior space on an extension of the emission path of the light beam while interposing a suitable lens between the device and the mirror, if necessary.

In order to produce excited carriers in the active layer 13, it is required to inject an electric current into the active layer 13. The constitution for this requirement is as described hereinafter, wherein a particularly effective arrangement is adopted.

On the p-type semiconductor multilayer reflecting mirror 14 is formed a p-type GaAs cap layer 15 having a thickness of 3000 Å and doped with high-concentration Zn. The particularly effective arrangement is that a plurality of divided electrodes 16 for hole injection are provided on the cap layer. In the embodiment shown in FIG. 1, the electrodes 16 comprise a disc-shaped electrode at the center and a plurality of ring-like electrodes concentric with the center electrode and arranged at prescribed intervals. With this structure, the in-plane distribution of holes injected from the electrodes into the active layer via the p-type cap layer 15 and p-type semiconductor multilayer reflecting mirror 14 can be controlled to be uniform by controlling voltage applied to the individual electrodes, and active control can be made in the operation of the device.

That is to say, while, in the conventional device, the hole flow through a very thin p-type semiconductor layer with high resistance into an active layer is deviated, resulting in an obstacle to uniform hole injection, the structure shown in the drawing makes it possible not only to inject holes uniformly into the active layer 13, but also to control the injection current distribution more positively to obtain a gain distribution suitable for a light distribution of an oscillation mode etc. When a light distribution of the fundamental mode having a single lobe is to be obtained, for example, the amounts of an electric current to be injected into the electrodes are set higher toward the central electrode. It is further possible to obtain a stable and highly precise lasing light, a lasing light beam of a desired far-field pattern, etc.

The divided electrodes 16 are not limited to the concentric ones as shown in FIG. 1, but can optionally be selected from a pattern of strips arranged in parallel, a predetermined plane pattern of dots each of circular, rectangular shape or the like, and other patterns.

On the other hand, the electrode for injecting electrons into the n-type semiconductor layer 12 with relatively low resistance can be formed more simply. In FIG. 1, a ring-like contact layer 17 in contact with the bottom surface of the n-type semiconductor layer (cladding layer) 12 is formed along the outer periphery of the light amplification section 11 formed into a predetermined solid (cylindrical shape in the drawing) as a whole, and an electrode 18 of an alloy of AuGe or the like formed on the contact layer is electrically connected via an electrode connecting member 19 to a wiring conductor 20 formed on the surface of the transparent substrate 12 around the light amplification section 11. The contact layer 17 has a thickness of about 1000 Å and can be constituted of an n-type GaAs layer, for example. The electrode connecting member 19 can be constituted of a solder of In or AuSn. The wiring conductor 20 can be constituted of Au or the like.

As mentioned briefly earlier, when the device shown in the drawing is used as an external resonator type surface light emitting laser, a resonator can be constituted of the p-type semiconductor multilayer reflecting mirror 14, and an external reflecting mirror and a lens which are not shown in the drawing. The lens is disposed in an exterior space opposite the active layer 13 on the side of the transparent substrate 21, and the external reflecting mirror is disposed on an extension of a line connecting the transparent substrate 21 and the lens. That is to say, the surface-type device 10 is disposed so that the substrate 21 faces the external reflecting mirror with the lens intervening therebetween. The device, lens and external reflecting mirror are placed on a fine-motion table capable of optical adjustment. The external reflecting mirror is a planar-type reflecting mirror that reflects light having an emission wavelength at sufficiently high reflectivity, e.g. a dielectric multilayer reflecting mirror having reflectivity of not less than 99%.

The light reflected by the p-type semiconductor multilayer reflecting mirror 14 is amplified again in the area of the active layer 13, collimated by the lens, reflected again by the external reflecting mirror, and returned to the active layer 13 and to the p-type semiconductor reflecting mirror 14. This sequence is repeated to give rise to laser oscillation. At this time, an adjustment mechanism such as the fine-motion table is used to optically adjust the device, lens and external reflecting mirror so as to reduce resonator loss. The distance between the external reflecting mirror and the device, i.e. the external resonator length, is made sufficiently small. This is for avoiding the influence of vibration etc.

An electric current is applied to the divided electrodes 16 so as to be matched with the light intensity distribution in the fundamental mode of single lobe, namely so that it flows mostly through the center electrode. By this, it is possible to realize an external resonator-type surface light emission laser with a large output. In addition, the electric current applied to the divided electrodes 16 is suitably modulated for the round-trip time of light passing through the length of the external resonator, e.g. modulated at 1 GHz where the round-trip time of light is 1 ns, with the result that an active mode-locking operation is assumed to enable generation of light pulses.

The surface-type light amplifier devices according to the present invention, inclusive of the one designated by 10 shown in FIG. 1(A), can be fabricated by various methods. However, a desirable process for fabricating the device 10 shown in FIG. 1(A) can be exemplified in FIG. 1(B). As shown at step 101, a commercially available GaAs substrate having a thickness of approximately 400 μm is used as a substrate for constructing a light amplification section, and on the substrate is formed an $Al_xGa_{1-x}As$ layer (x=0.6) having a thickness of around 3000 Å that functions as an etching prevention layer in a subsequent etching step.

On the etching prevention layer is constructed the light amplification section 11 of FIG. 1(A), in an inverted state, as shown at step 102. Therefore, the divided electrodes 16 cannot be formed at this step. To be specific, the p-type cap layer 15, p-type semiconductor multilayer reflecting mirror 14, active layer 13, n-type cladding layer 12 and contact layer 17 are successively deposited in the order mentioned. The light amplification section 11 in a predetermined three-dimensional shape such as a columnar shape is formed by using a deposition technique and lithography or a like technique together. Lithography is similarly utilized to remove part of the contact layer 17 present at the beam passageway and exhibiting a large optical loss. The antireflection coating 23 is further formed when found necessary by using a coating technique and lithography together.

As shown at subsequent step 103, to the side of the n-type cladding layer 12 exposed to the outside, namely to the side of the antireflection coating 23 when formed, is attached a transparent substrate 21, such as of glass, having a highly flat surface via the transparent adhesive of polyimide or the like applied uniformly onto that side.

The physical strength of the light amplification section 11 is thus secured beforehand so as not to induce any physical or optical distortion. The thus constructed structure is then subjected to a substrate polishing step. Since the substrate is as thick as about 400 μm as shown above, it is polished as shown at step 104 using a mechanical polishing method so that the resultant thickness is approximately 30 to 100 μm.

After the substrate has been polished to have such a thickness, it is etched at an appropriate temperature with a suitable solution, e.g. at about 20° C. with a mixed solution of one part of ammonia and twenty parts of a hydrogen peroxide solution as shown at step 105. When the aforementioned $A_xGa_{1-x}As$ layer (x=0.6) has been formed as an etching prevention layer on the substrate, the substrate can be etched up to the etching prevention layer at high speed of about 20 μm/min without strictly managing the etching time, and it is possible to stop the etching. As the etching prevention layer, an AlAs layer or the like can also be used.

As shown at subsequent step 106, the etching prevention layer is removed by etching it with a mixed solution of phosphoric acid, a hydrogen peroxide solution and water ($H_3PO_4:H_2O_2:H_2O=3:1:50$) at about 20° C. Since this etching is effected at a speed of about 1000 Å/min., the etching prevention layer can be easily removed under time management.

When the surface of the p-type cap layer 15 of the light amplification section 11 has been exposed to the outside, a predetermined number of divided electrodes 16 for injection of holes are formed in a predetermined pattern of arrangement as shown at step 107 by depositing an alloy of AuZn or the like onto the entire surface of the cap layer and then effecting lithography, or by using a printing technique after a predetermined pattern.

The electrical structural parts 17 to 20 to be formed on the n-type semiconductor layer (cladding layer) 12 not described in detail herein above can be fabricated by a known method comprising suitable steps.

Although a preferred embodiment has been described in the foregoing, any modification can be made therein insofar as it does not depart from the gist of the present invention. In addition to AlGaAs used as the material for the light amplification section 11, InGaAsP, GaN, etc. that similarly fall under Group III–V semiconductors and photo-semiconductor materials such as ZnSe that fall under Group II–VI semiconductors can also be used.

According to the present invention, since the substrate used for constructing a light amplification section can be removed and since light can be transmitted through a transparent substrate, the degree of freedom with respect to improvements in the light amplification section increases to a great extent.

When an electrode for injection of holes to be provided on the side of a p-type semiconductor layer is composed of a plurality of divided electrodes in accordance with the preferred embodiment of the present invention, the amount of an electric current applied to each of the divided electrodes can be controlled to enable carrier distribution in an active layer to be actively controlled. As a consequence, it is possible to inject carriers in accordance with light intensity distribution in the fundamental mode having a single lobe when fabricating an external resonator-type surface light emitting laser to enable the operation in the fundamental mode to be stabilized.

Furthermore, when the side of the transparent substrate is used as a light emitting side, the p-type semiconductor functions as a multilayer reflecting mirror. For this reason, due to the optical stability of the p-type multilayer reflecting mirror obtained by fixing it to the transparent substrate, the range of effective active region can be enlarged to materialize a current injection-type external resonator-type surface light emitting laser with a large output, a light beam reflecting-type amplifier with a large diameter, etc. It is fully possible to achieve generation of a light beam having a diameter of several hundreds of μm or more. It goes without saying that since the surface-type light amplifier device of the present invention is of a current injection type, an external-resonator active-mode locking surface light emitting laser can be materialized. In this case, a high output of light pulses can be generated.

What is claimed is:

1. A method for fabricating a surface-type light amplifier device having a light amplification section that includes a structure of an active layer sandwiched between a p-type semiconductor layer and an n-type semiconductor layer for producing excited carriers and emitting a light beam in a direction rising with a specific angle relative to a surface of a support substrate, said method comprising:

forming said light amplification section on a structural substrate for forming said light amplification section;

applying an antireflectin coating application treatment to at least one of a surface of said light amplification section and a surface of a transparent substrate;

attaching the surface of said light amplification section to the surface of said transparent substrate such that said transparent substrate is attached to a surface of said n-type semiconductor layer; and removing said structural substrate.

2. A method for fabricating a surface-type light amplifier device according to claim 1, wherein:

said p-type semiconductor layer, said active layer and said n-type semiconductor layer are deposited on said structural substrate in the order mentioned; and a surface of said p-type semiconductor layer exposed after th removal of said structural substrate is formed with a plurality of divided electrodes for forming electrical continuity relative to said p-type semiconductor layer and injecting carries into said active layer.

* * * * *